United States Patent
Herner et al.

(10) Patent No.: US 8,049,104 B2
(45) Date of Patent: Nov. 1, 2011

(54) INTERMETAL STACK FOR USE IN A PHOTOVOLTAIC CELL

(75) Inventors: S. Brad Herner, San Jose, CA (US); Mark H. Clark, Santa Clara, CA (US)

(73) Assignee: Twin Creek Technologies, Inc., San Jose, CA (US)

( * ) Notice: Subject to any disclaimer, the term of this patent is extended or adjusted under 35 U.S.C. 154(b) by 0 days.

(21) Appl. No.: 12/571,415

(22) Filed: Sep. 30, 2009

(65) Prior Publication Data

US 2011/0076796 A1  Mar. 31, 2011

(51) Int. Cl.
*H01L 31/00* (2006.01)

(52) U.S. Cl. .......................................... 136/261; 438/85

(58) Field of Classification Search .................. 136/261; 438/85
See application file for complete search history.

(56) References Cited

U.S. PATENT DOCUMENTS

| | | | |
|---|---|---|---|
| 4,392,011 A * | 7/1983 | Pankove et al. | 136/261 |
| 5,279,679 A | 1/1994 | Murakami et al. | |
| 5,374,564 A * | 12/1994 | Bruel | 438/455 |
| 5,569,332 A | 10/1996 | Glatfelter et al. | |
| 6,146,979 A | 11/2000 | Henley et al. | |
| 6,951,689 B1 | 10/2005 | Higashikawa | |
| 7,498,234 B2 | 3/2009 | Aspar et al. | |
| 2005/0092357 A1* | 5/2005 | Deng | 136/252 |
| 2007/0277874 A1 | 12/2007 | Dawson-Elli et al. | |
| 2009/0194153 A1* | 8/2009 | Hilali et al. | 136/255 |
| 2009/0194162 A1 | 8/2009 | Sivaram et al. | |
| 2009/0293931 A1* | 12/2009 | Petti | 136/244 |
| 2010/0139755 A1* | 6/2010 | Petti et al. | 136/256 |

OTHER PUBLICATIONS

Shah et al., "Towards very low-cost mass production of thin-film silicon photovoltaic (PV) solar modules on glass", Thin Solid Films, vol. 502, Issues 1-2, Apr. 28, 2006, pp. 292-299.
S. Kim, J-H. Jang, and J-S. Lee, "Thermally stable and highly reflective ITO/Ag-based ohmic contacts to p-GaN," J. Electrochemical Society 154 (11), H973-H976 (2007).
C.M. Liu, W.L. Liu, W.J. Chen, S.H. Hsieh, T.K. Tsai, and L.C. Yang, "ITO as a diffusion barrier between Si and Cu," J. Electrochemical Society 152 (3), G234-G239 (2005).
U.S. Appl. No. 12/540,463, filed Aug. 13, 2009, entitled "Intermetal Stack for use in a Photovoltaic Device".

* cited by examiner

*Primary Examiner* — N Drew Richards
*Assistant Examiner* — Grant Withers
(74) *Attorney, Agent, or Firm* — The Mueller Law Office, P.C.

(57) ABSTRACT

A donor silicon wafer may be bonded to a substrate and a lamina cleaved from the donor wafer. A photovoltaic cell may be formed from the lamina bonded to the substrate. An intermetal stack is described that is optimized for use in such a cell. The intermetal stack may include a transparent conductive oxide layer serving as a quarter-wave plate, a low resistance layer, an adhesion layer to help adhesion to the receiver element, and may also include a barrier layer to prevent or impede unwanted diffusion within the stack.

6 Claims, 6 Drawing Sheets

Embodiment of 12/026530

Embodiment of 12/026530

Embodiment of 12/026530

Embodiment of 12/026530

INTERMETAL STACK FOR USE IN A PHOTOVOLTAIC CELL

RELATED APPLICATIONS

This application is a continuation-in-part of U.S. patent application Ser. No. 13/048,955 filed Mar. 16, 2011, entitled "Asymmetric Surface Texturing for Use in a Photovoltaic Cell and Method of Making"; which is a continuation of U.S. patent application Ser. No. 12/130,241 filed May 30, 2008, entitled "Asymmetric Surface Texturing for Use in a Photovoltaic Cell and Method of Making" and now issued as U.S. Pat. No. 7,915,522, all of which are hereby incorporated by reference for all purposes.

BACKGROUND OF THE INVENTION

The invention relates to an intermetal stack for use in a semiconductor device such as a photovoltaic cell.

In a conventional photovoltaic cell, a metal layer or stack at the back of the cell provides for electrical connection to the cell, and also provides a reflective layer, reflecting light back into the cell, allowing additional light to be absorbed. Some fabrication methods put constraints on the composition of this metal layer or stack.

There is a need, therefore, to optimize the intermetal stack for a photovoltaic cell.

SUMMARY OF THE PREFERRED EMBODIMENTS

The present invention is defined by the following claims, and nothing in this section should be taken as a limitation on those claims. In general, the invention is directed to an intermetal stack for use in a photovoltaic cell.

A first aspect of the invention provides for a method to form a photovoltaic cell, the method comprising the steps of providing a substantially crystalline semiconductor lamina and a receiver element, wherein a transparent conductive oxide layer and a metal layer or stack are disposed between the lamina and the receiver element; and heating the lamina, receiver element, and transparent conductive oxide and metal layer or stack to at least about 450 degrees C., wherein the lamina is suitable for use in the photovoltaic cell.

An embodiment of the invention provides for a method to form a photovoltaic cell, the method comprising the steps of providing a semiconductor donor body having a cleave plane defined within; affixing a semiconductor donor body to a receiver element, wherein a transparent conductive oxide and a metal layer or stack are disposed between the donor body and the receiver element; and cleaving a semiconductor lamina from the semiconductor donor body at the cleave plane, wherein the lamina remains affixed to the receiver element, wherein the lamina is suitable for use in the photovoltaic cell.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
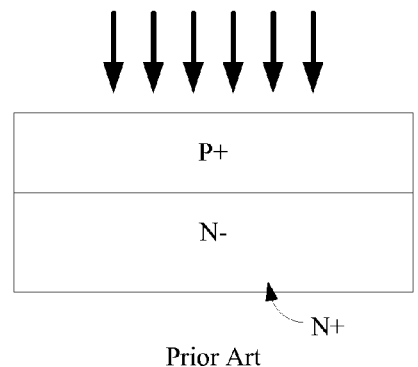
FIG. 1 is a cross-sectional drawing of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n− junction (as shown in FIG. 1) or a n+/p− junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
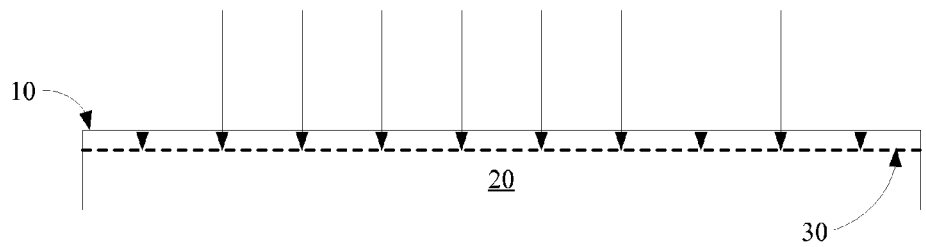
FIGS. 2a-2d are cross-sectional drawings of stages of fabrication of a photovoltaic cell formed according to an embodiment of U.S. patent application Ser. No. 12/026,530.
Figure 2B:
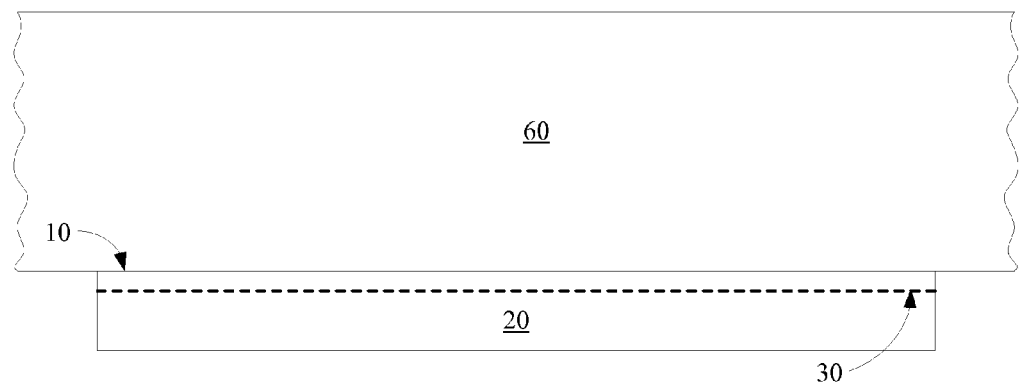
Figure 2C:
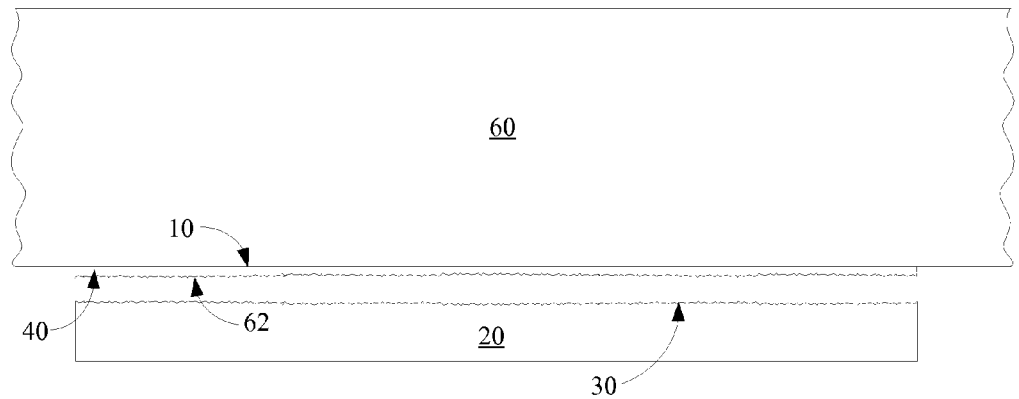
Figure 2D:
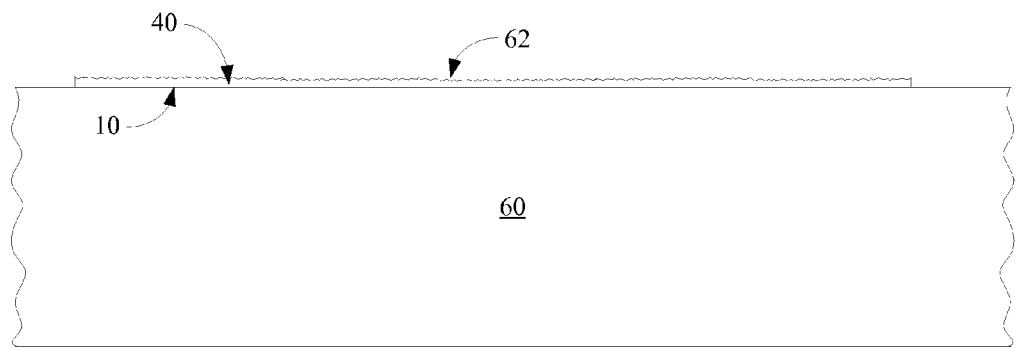

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

In some embodiments the lamina or laminae may be annealed after cleaving to repair damage caused to the silicon by the implant. In this case the receiver element and all other materials present in the structure at this stage should be selected to tolerate the anneal temperature.

Using the methods of Sivaram et al., photovoltaic cells, rather than being formed from sliced wafers, are formed of thin semiconductor laminae without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

Referring to FIG. 2d, in a photovoltaic cell formed using methods like those described in Sivaram et al., in which light falls initially on the photovoltaic cell including silicon lamina 40, and the receiver element 60 serves as the substrate, a metal layer or stack is typically formed at the back of the photovoltaic cell, interposed between lamina 40 and receiver element 60. The method of fabrication and the configuration of the device impose a variety of requirements on this metal layer or stack. A single material is unlikely to satisfy all these requirements.

In the present invention, an intermetal stack has been optimized to accommodate the competing requirements of this structure and the method of forming it. As will be seen, the stack of the present invention allows for good ohmic contact to the lamina, good adhesion to both the lamina and the receiver element, low resistance, good reflectivity, and tolerance of high temperature.

Figure 3A:
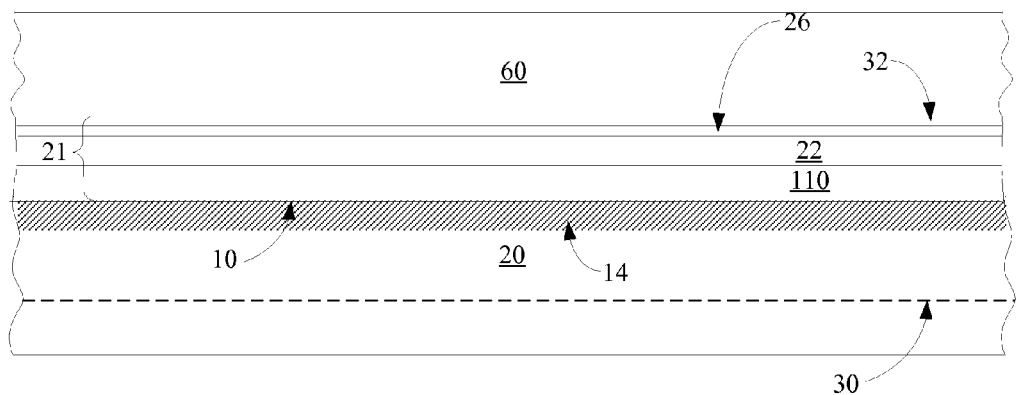
FIGS. 3a and 3b are cross-sectional drawings showing stages in fabrication of a photovoltaic cell including a semiconductor lamina and an intermetal stack formed according to an embodiment of the present invention.

FIG. 3a shows the structure during fabrication. Heavily doped region 14, which may serve as either a base contact or an emitter in the completed cell, is formed by doping at first surface 10 of donor wafer 20. Donor wafer 20 is implanted, as described earlier, to define cleave plane 30, and is affixed to receiver element 60. An intermetal stack 21, including transparent conductive oxide (TCO) layer 110, a low-resistance layer 22, and adhesion layer 32, is disposed between donor wafer 20 and receiver element 60. As will be seen, a non-reactive barrier layer 26 may be included between adhesion layer 32 and the rest of the stack 21 to prevent diffusion from adhesion layer 32 through the stack and into the semiconductor material of donor wafer 20.

Figure 3B:
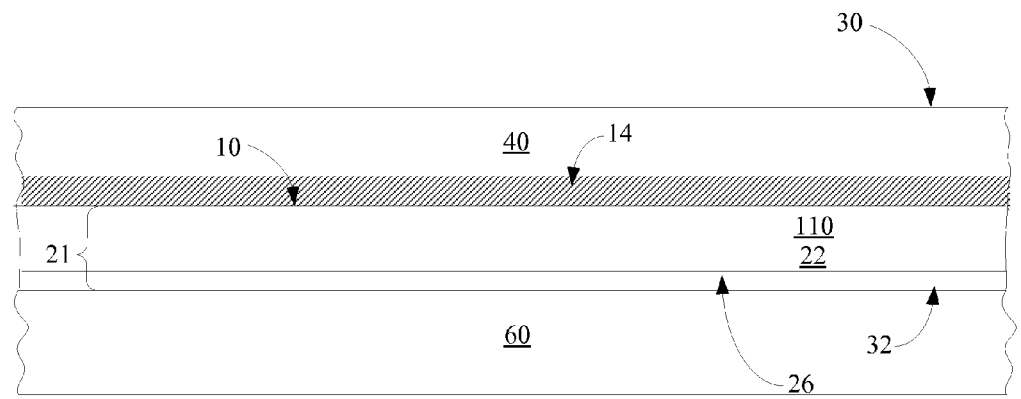

FIG. 3b shows the structure inverted, with receiver element 60 on the bottom, as during operation in the completed device in some embodiments. Lamina 40 is cleaved from the donor wafer at the cleave plane.

Intermetal stack 21 must adhere not only to lamina 40, but also to receiver element 60. Receiver element 60 may be any suitable material, for example glass, semiconductor, metal, ceramic, or polymer. Receiver element 60 may also be a laminate, where the surface contacting intermetal stack 21 is one of these materials. The TCO layer 110 can be, for example, indium tin oxide, as well as aluminum-doped zinc oxide, tin oxide, titanium oxide, $SnO_2$ doped with $Sb_2O_5$, $SnO_2$ doped with fluorine, etc. Low-resistance layer 22 is advantageously selected to be relatively low-resistance, to adhere well to TCO 110, to be able to tolerate bonding and exfoliation temperatures, and have relatively high reflectance. Nickel, molybdenum, and silver, or alloys thereof, may be suitable choices. Titanium serves well as adhesion layer 32. A non-reactive barrier layer 26 between titanium adhesion layer 32 and low-resistance layer 22 will serve to prevent unwanted diffusion of titanium through low-resistance layer 22, TCO 110, and into the lamina to be formed. Suitable choices for non-reactive barrier layer 26 include, for example, TiN, TiW, W, Ta, TaN, TaSiN, Ni, Mo, Zr, or alloys thereof.

The TCO layer 110 performs multiple roles in this cell. It serves to enhance the reflectivity from low-resistance layer 22, particularly when its thickness selected to be one-quarter the wavelength of the incoming light. Reflecting more light back into the lamina increases cell efficiency. The TCO layer 110 also provides electrical contact between heavily doped base contact or emitter region 14 and the metal layers making up intermetal stack 21, where this current can be collected from outside the cell.

Summarizing, a photovoltaic cell can be formed by providing a substantially crystalline semiconductor lamina and a receiver element, wherein a transparent conductive oxide layer and a metal layer or stack are disposed between the lamina and the receiver element; and heating the lamina, receiver element, and transparent conductive oxide and metal layer or stack to at least about 450 degrees C., wherein the lamina is suitable for use in the photovoltaic cell. The photovoltaic cell is fabricated, wherein the photovoltaic cell comprises the lamina. In some embodiments, the lamina, receiver element, and TCO may be heated to at least 600 degrees C., at least 800 degrees C., or more. A metal layer or stack, such as low-resistance layer 22, non-reactive barrier layer 26, and adhesion layer 32, may be disposed between the receiver element and the TCO.

A photovoltaic assembly formed in this manner includes a substantially crystalline semiconductor lamina having a thickness less than about ten microns, or less than about five microns, wherein the lamina comprises as least a portion of the base of a photovoltaic cell. A TCO layer is disposed between the lamina and a metal layer or stack. In the completed cell, light traverses the lamina, and is reflected from the metal layer or stack back into the lamina, the TCO layer serving as a quarter-wave plate. The lamina is bonded to a receiver element, the TCO layer and metal layer or stack disposed between them. The photovoltaic assembly comprises a photovoltaic cell.

For clarity, a detailed example of a photovoltaic assembly including a receiver element and a lamina having thickness between 0.2 and 100 microns, including an intermetal stack formed according to embodiments of the present invention, will be provided. For completeness, many materials, conditions, and steps will be described. It will be understood, however, that many of these details can be modified, augmented, or omitted while the results fall within the scope of the invention.

Example

The process begins with a donor body of an appropriate semiconductor material. An appropriate donor body may be a monocrystalline silicon wafer of any practical thickness, for example from about 200 to about 1000 microns thick. Typically the wafer has a <100> orientation, though wafers of other orientations may be used. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 4A:
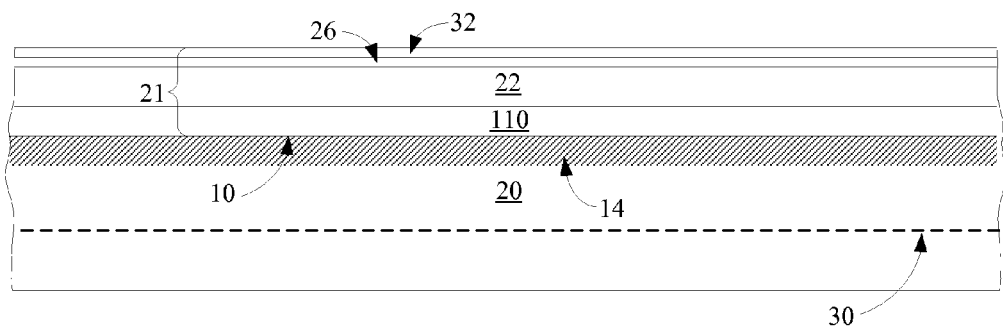
FIGS. 4a-4e are cross-sectional drawings illustrating stages in formation of a photovoltaic cell according to an embodiment of the present invention.

Referring to FIG. 4a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1\times10^{15}$ and about $1\times10^{18}$ dopant atoms/cm$^3$, for example about $1\times10^{17}$ dopant atoms/cm$^3$. Donor wafer 20 may be, for example, solar- or semiconductor-grade silicon.

First surface 10 of donor wafer 20 may be substantially planar, or may have some preexisting texture. If desired, some texturing or roughening of first surface 10 may be performed, for example by wet etch or plasma treatment. Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Methods to create surface roughness are described in further detail in Petti, U.S. patent application Ser. No. 12/130,241, "Asymmetric Surface Texturing For Use in a Photovoltaic Cell and Method of Making," filed May 30, 2008; and in Herner, U.S. patent application Ser. No. 12/343,420, "Method to Texture a Lamina Surface Within a Photovoltaic Cell," filed Dec. 23, 2008, both owned by the assignee of the present application and both hereby incorporated by reference.

First surface 10 may be heavily doped to some depth to the same conductivity type as wafer 20, forming heavily doped region 14; in this example, heavily doped region 14 is n-type. As wafer 20 has not yet been affixed to a receiver element, high temperatures can readily be tolerated at this stage of fabrication, and this doping step can be performed by any conventional method, including diffusion doping. Any conventional n-type dopant may be used, such as phosphorus or arsenic. Dopant concentration may be as desired, for example at least $1\times10^{18}$ dopant atoms/cm$^3$, for example between about $1\times10^{18}$ and $1\times10^{21}$ dopant atoms/cm$^3$. Doping and texturing can be performed in any order, but since most texturing methods remove some thickness of silicon, it may be preferred to form heavily doped n-type region 14 following texturing. Heavily doped region 14 will provide electrical contact to the base region in the completed device.

In the next step, ions, preferably hydrogen or a combination of hydrogen and helium, are implanted into wafer 20 to define cleave plane 30, as described earlier. The cost of this hydrogen or helium implant may be reduced by methods described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009, both owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns.

Next, in the present embodiment, a TCO layer 110 is formed on first surface 10. A variety of materials may be used for TCO 110, including indium tin oxide, as well as aluminum-doped zinc oxide, tin oxide, titanium oxide, $SnO_2$ doped with $Sb_2O_5$, etc. As will be seen, in the present example, first surface 10 will be at the back of the completed photovoltaic cell, and a reflective material is to be formed on TCO 110. The reflectivity of the metallic layer to be formed is enhanced if TCO 110 is of an appropriate thickness to serve as a quarter-wave plate, for example between about 550 and 600 angstroms when TCO 110 is indium tin oxide and the donor wafer 20 is silicon. The thickness of this layer will be adjusted when other materials are used, as is known in the art. Most TCOs adhere well to silicon and can tolerate relatively high temperature.

Low-resistance layer 22 is formed on TCO layer 110. Low-resistance layer 22 can be any suitable conductive layer or stack. As will be seen, in some embodiments, low-resistance layer 22 must tolerate temperatures of 600, 800, 900 degrees C. or more. In some embodiments, low-resistance layer 22 is nickel or a nickel alloy which is at least 90 percent nickel. It has been found that nickel provides unexpectedly good adhesion to indium tin oxide (ITO), when ITO is used for TCO layer 110 and these two layers are in immediate contact. Nickel can readily tolerate high temperature, has relatively low resistivity, and, when paired with a TCO of suitable thickness, has acceptable reflectance. The thickness of nickel layer 22 may be between about 1000 angstroms and about 4 microns, for example between about 5000 angstroms and about 1 micron. In some embodiments, other materials may be used, such as molybdenum, cobalt, silver, or alloys thereof. In some embodiments layer 22 may be a stack of conductive materials.

Non-reactive barrier layer 26 is formed by any suitable method, for example by sputtering or thermal evaporation. Non-reactive barrier layer 26 may be any material or stack of materials that will provide a barrier to diffusion of adhesion layer 32. In some embodiments non-reactive barrier layer 26 may be omitted. Suitable materials for non-reactive barrier layer include TiN, TiW, W, Ta, TaN, TaSiN, Ni, Mo, Zr, or alloys thereof. The thickness of non-reactive barrier layer 26 may range from, for example, between about 100 and about 2000 angstroms thick, for example about 700 angstroms thick.

In this example an adhesion layer 32 is formed on non-reactive barrier layer 26. Adhesion layer 32 is a material that will adhere to receiver element 60, for example titanium or an alloy of titanium, for example an alloy which is at least 90 atomic percent titanium. In alternative embodiments, adhesion layer 32 can be a suitable dielectric material, such as Kapton or some other polyimide. Non-reactive barrier layer 26 will not be required for some of these alternative materials.

In some embodiments, adhesion layer 32 is between about 100 and about 5000 angstroms, for example about 400 angstroms.

In alternative embodiments, some of the layers making up intermetal stack 21, such as adhesion layer 32 and non-reactive barrier layer 26, could be deposited on receiver element 60 instead of on donor wafer 20.

Figure 4B:
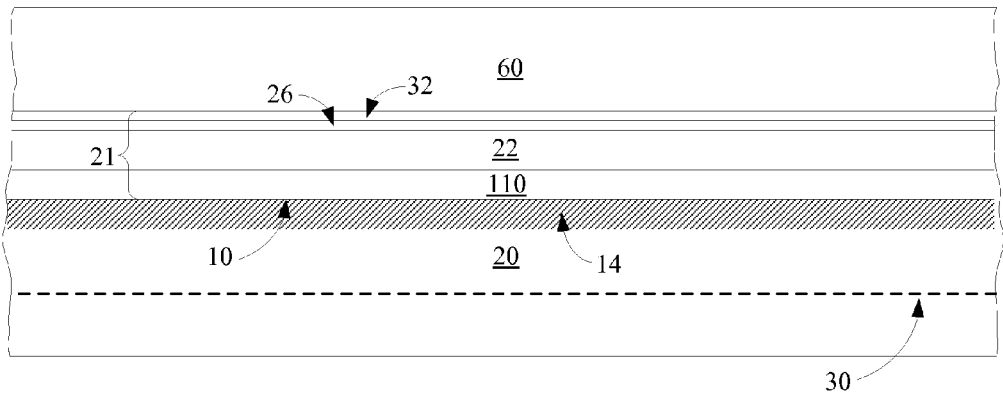

Turning to FIG. 4b, wafer 20 is affixed to a receiver element 60, with TCO layer 110, low-resistance layer 22, non-reactive barrier layer 26, and adhesion layer 32 intervening. Receiver element 60 may be any suitable material, including glass, such as soda-lime glass or borosilicate glass; a metal or metal alloy such as stainless steel or aluminum; a polymer; or a semiconductor, such as metallurgical grade silicon. The wafer 20, receiver element 60, and intervening layers are bonded by any suitable method, for example by anodic bonding. In some embodiments, receiver element 60 has a widest dimension no more than about twenty percent greater than the widest dimension of wafer 20, and in most embodiments the widest dimension may be about the same as that of wafer 20. In other embodiments, receiver element 60 is significantly larger than wafer 20, and additional donor wafers may be bonded to the same receiver element.

Figure 4C:
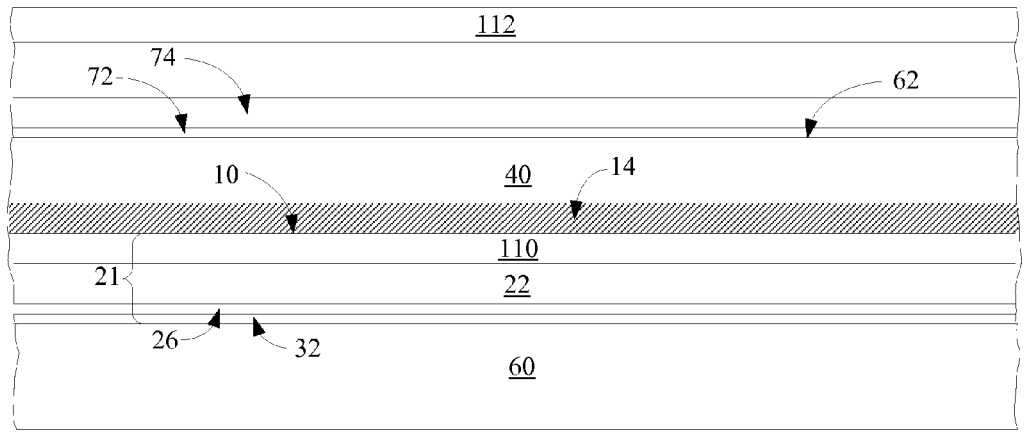

Referring to FIG. 4c, which shows the structure inverted with receiver element 60 on the bottom, a thermal step causes lamina 40 to cleave from the donor wafer at the cleave plane. In some embodiments, this cleaving step may be combined with a bonding step. Cleaving is achieved in this example by exfoliation, which may be achieved at temperatures between, for example, about 350 and about 650 degrees C. In general, exfoliation proceeds more rapidly at higher temperature. The thickness of lamina 40 is determined by the depth of cleave plane 30. In many embodiments, the thickness of lamina 40 is between about 1 and about 10 microns, for example between about 2 and about 5 microns, for example about 4.5 microns. Bonding and exfoliation may be achieved using methods described in Agarwal et al., U.S. patent application Ser. No. 12/335,479, "Methods of Transferring a Lamina to a Receiver Element," filed Dec. 15, 2008, owned by the assignee of the present application and hereby incorporated by reference.

Second surface 62 has been created by exfoliation. Second surface 62 will typically have some damage, and steps may be taken to remove or repair this damage. Some damage may be removed by wet etching, for example with KOH or TMAH. Some thickness of silicon will be removed by this etch, for example between about 3000 to 7000 angstroms or more. In general a deeper implant (resulting in a thicker lamina) will have a thicker damaged zone to be removed. An etch step intended to create some texture at this surface to increase internal reflection may be combined with the damage-removal etch, or may be performed independently.

In some embodiments, an anneal may be performed, for example following the damage-removal etch, to repair implant damage within the body of lamina 40. Annealing may be performed, for example, at 500 degrees C. or greater, for example at 550, 600, 650, 700 degrees C. or greater, up to about 950 degrees C. The structure may annealed, for example, at about 650 degrees C. for about 45 minutes, or at about 800 degrees for about two minutes, or at about 950 degrees for 30 seconds or less. In other embodiments, no damage anneal is performed.

Still referring to FIG. 4c, if an anneal was performed, an oxide may form on second surface 62 which may be removed by any conventional cleaning step, for example by etching in dilute hydrofluoric acid. After cleaning, a silicon layer is deposited on second surface 62. This layer 74 includes heavily doped silicon, and may be amorphous, microcrystalline, nanocrystalline, or polycrystalline silicon, or a stack including any combination of these. This layer or stack may have a thickness, for example, between about 100 and about 350 angstroms. FIG. 4c shows an embodiment that includes intrinsic amorphous silicon layer 72 between second surface 62 and doped layer 74. In other embodiments, layer 72 may be omitted. In this example, heavily doped silicon layer 74 is doped p-type, opposite the conductivity type of lightly doped n-type lamina 40, and serves as the emitter of the photovoltaic cell being formed, while lightly doped n-type lamina 40 comprises the base region. If included, layer 72 is sufficiently thin that it does not impede electrical connection between lamina 40 and doped silicon layer 74.

A TCO layer 112 is formed on heavily doped silicon layer 74. Appropriate materials for TCO 112 include any of the materials listed for TCO layer 110. This layer may be, for example, about 850 angstroms thick, and serves as both a top electrode and an antireflective layer. In alternative embodiments, an additional antireflective layer (not shown) may be formed on top of TCO 112.

A photovoltaic cell has been formed, including lightly doped n-type lamina 40, which comprises the base of the cell, and heavily doped p-type microcrystalline silicon layer 74, which serves as the emitter of the cell. Heavily doped n-type region 14 will improve electrical contact to the cell. Electrical contact must be made to both faces of the cell. This contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference.

Figure 4D:
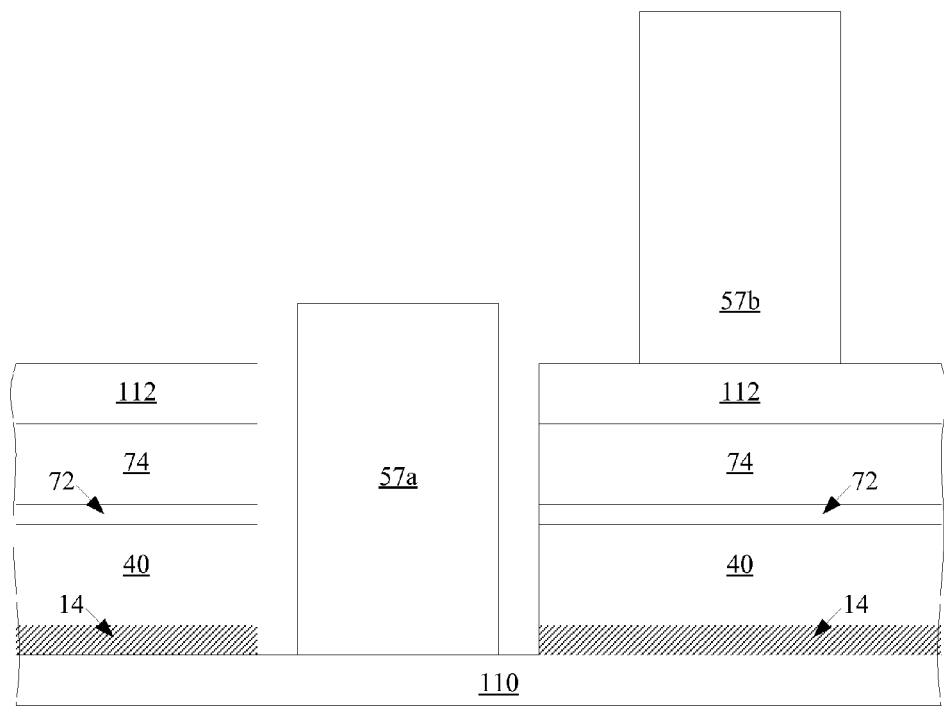

FIG. 4d shows an enlarged section of lamina 40 and associated layers. For simplicity this figure is abbreviated; layers below TCO 110, and receiver element 60, have been omitted. Electrical contact can be made to base contact region 14 by forming holes or channels in lamina 40, for example by laser ablation. It has been found that silicon readily ablates, leaving conductive layers, for example TCO layer 110, intact. Contact can be made to TCO layer 110, which contacts base contact region 14, by way of the holes or channels. If TCO layer 110 is removed by laser ablation, contact is made to the sidewalls of TCO 110 in the holes or channels. Gridlines 57a can be formed of, for example, screenprinted silver paste in the holes or channels. Contact to the light-facing surface of the cell is made by forming gridlines 57b on top TCO 112, which contacts amorphous emitter region 74. Gridlines 57a and 57b both contact the same material, a TCO, and thus can be formed in the same process step, of the same material, and be optimized for such a contact. Note that this and other figures are not to scale.

Figure 4E:
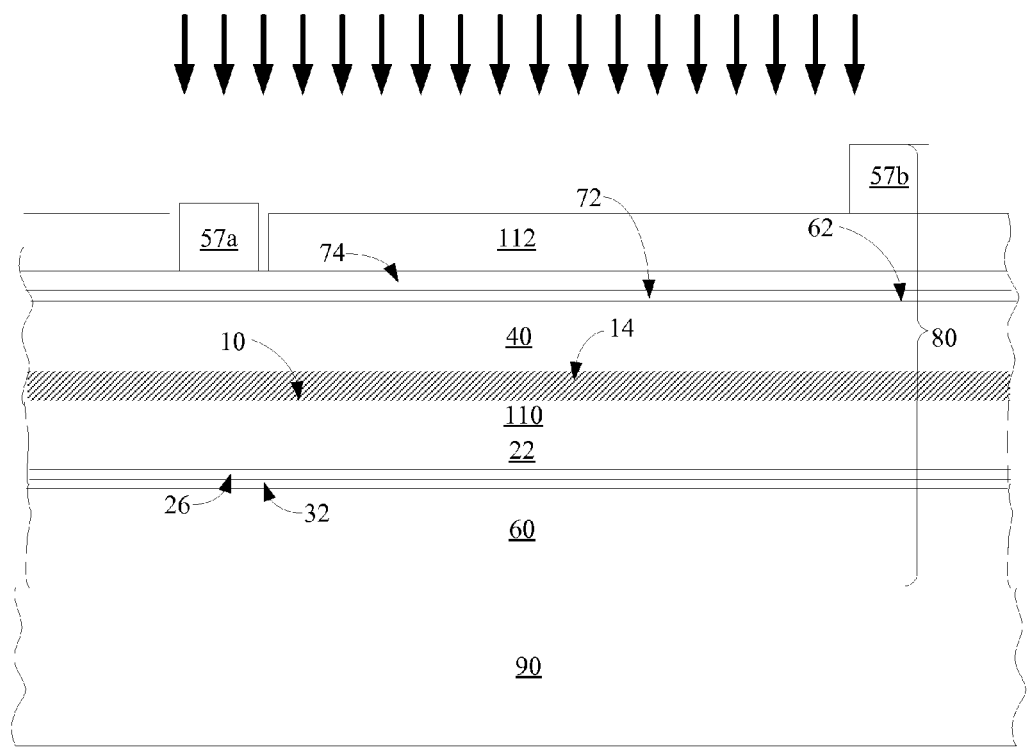

FIG. 4e shows completed photovoltaic assembly 80, which includes a photovoltaic cell and receiver element 60. The cell includes a base, which is the lightly doped n-type body of lamina 40, and the emitter, heavily doped p-type amorphous or microcrystalline silicon layer 74. Heavily doped n-type region 14 provides electrical contact to the base. In alternative embodiments, by changing the dopants used, heavily doped region 14 may serve as the emitter, at first surface 10, while heavily doped silicon layer 74 serves as a contact to the base region. Incident light (indicated by arrows) falls on TCO 112, enters the cell at heavily doped p-type amorphous or microcrystalline silicon layer 74, enters lamina 40 at second surface 62, and travels through lamina 40. In this embodiment, receiver element 60 serves as a substrate. If receiver element 60 has, for example, a widest dimension about the same as that of lamina 40, the receiver element 60 and lamina 40, and associated layers, form a photovoltaic assembly 80. Multiple photovoltaic assemblies 80 can be formed and affixed to a supporting substrate 90 or, alternatively, a supporting superstrate (not shown).

A photovoltaic cell has been formed by providing a semiconductor donor body having a cleave plane defined within; affixing a semiconductor donor body to a receiver element, wherein a transparent conductive oxide and a metal layer or stack are disposed between the donor body and the receiver element; and cleaving a semiconductor lamina from the semiconductor donor body at the cleave plane, wherein the lamina remains affixed to the receiver element, wherein the lamina is suitable for use in the photovoltaic cell. The photovoltaic cell is fabricated, wherein the photovoltaic cell comprises the lamina. In some embodiments, between the affixing step and completion of the fabricating step, the transparent conductive oxide and the metal layer or stack are subjected to a temperature of 600, 800 degrees C. or more. The metal layer or stack may include, for example, a layer of nickel or a nickel alloy, a layer of titanium nitride, and a layer of titanium or a titanium alloy. As described, a hole or channel may be formed in the lamina by laser ablation, and an electrical contact to the transparent conductive oxide may be formed in the hole or channel.

In other embodiments, a plurality of donor wafers may be affixed to a single receiver element, yielding multiple laminae, which are fabricated into photovoltaic cells as described. The photovoltaic cells may be electrically connected in series, forming a photovoltaic module.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method comprising the steps of:
providing a substantially crystalline semiconductor lamina and a receiver element, wherein a transparent conductive oxide layer and a metal layer or stack are disposed between the lamina and the receiver element; and
heating the lamina, receiver element, and transparent conductive oxide and metal layer or stack to at least about 450 degrees C.,
wherein the lamina is suitable for use in a photovoltaic cell, and wherein the metal layer or stack comprises a layer of nickel or a nickel alloy.

2. The method of claim 1 wherein the transparent conductive oxide is indium tin oxide and the metal layer or stack comprises a layer of nickel or a nickel alloy in immediate contact with the indium tin oxide.

3. The method of claim 1 wherein the metal layer or stack comprises (a) a layer of nickel or a nickel alloy, and (b) a layer of titanium nitride, and (c) a layer of titanium or a titanium alloy.

4. A method comprising the steps of:
providing a semiconductor donor body having a cleave plane defined within;
affixing a semiconductor donor body to a receiver element, wherein a transparent conductive oxide and a metal layer or stack are disposed between the donor body and the receiver element;
cleaving a semiconductor lamina from the semiconductor donor body at the cleave plane, wherein the lamina remains affixed to the receiver element;
heating the lamina, receiver element, and transparent conductive oxide and metal layer or stack to at least about 450 degrees C.;
forming a hole or channel in the lamina by laser ablation; and
forming an electrical contact to the transparent conductive oxide in the hole or channel;
wherein the lamina is suitable for use in a photovoltaic cell.

5. A method comprising the steps of:
providing a semiconductor donor body having a cleave plane defined within;
affixing a semiconductor donor body to a receiver element, wherein a transparent conductive oxide and a metal layer or stack are disposed between the donor body and the receiver element;
cleaving a semiconductor lamina from the semiconductor donor body at the cleave plane, wherein the lamina remains affixed to the receiver element; and
heating the lamina, receiver element, and transparent conductive oxide and metal layer or stack to at least about 450 degrees C.;
wherein the lamina is suitable for use in a photovoltaic cell; and
wherein the transparent conductive oxide is indium tin oxide and the metal layer or stack comprises a layer of nickel or a nickel alloy in immediate contact with the indium tin oxide.

6. A method comprising the steps of:
providing a semiconductor donor body having a cleave plane defined within;
affixing a semiconductor donor body to a receiver element, wherein a transparent conductive oxide and a metal layer or stack are disposed between the donor body and the receiver element;
cleaving a semiconductor lamina from the semiconductor donor body at the cleave plane, wherein the lamina remains affixed to the receiver element; and
heating the lamina, receiver element, and transparent conductive oxide and metal layer or stack to at least about 450 degrees C.;
wherein the lamina is suitable for use in a photovoltaic cell; and
wherein the metal layer or stack comprises (a) a layer of nickel or a nickel alloy, and (b) a layer of titanium nitride, and (c) a layer of titanium or a titanium alloy.

* * * * *